(12) United States Patent
Holovnia

(10) Patent No.: US 8,697,989 B2
(45) Date of Patent: Apr. 15, 2014

(54) METER BOX COVER

(75) Inventor: Lee Holovnia, Northboro, MA (US)

(73) Assignee: Inner-Tite Corp., Holden, MA (US)

( * ) Notice: Subject to any disclaimer, the term of this patent is extended or adjusted under 35 U.S.C. 154(b) by 54 days.

(21) Appl. No.: 13/372,662

(22) Filed: Feb. 14, 2012

(65) Prior Publication Data

US 2012/0206028 A1   Aug. 16, 2012

Related U.S. Application Data

(60) Provisional application No. 61/442,545, filed on Feb. 14, 2011.

(51) Int. Cl.
*H02G 3/08* (2006.01)

(52) U.S. Cl.
USPC .............. 174/50; 174/539; 361/664; 312/237

(58) Field of Classification Search
USPC .................... 174/539, 50; 361/672, 664, 659; 312/237; 24/457; 439/535; 220/4.02
See application file for complete search history.

(56) References Cited

U.S. PATENT DOCUMENTS

| | | | | |
|---|---|---|---|---|
| 2,882,454 A | * | 4/1959 | Davis, III | 361/672 |
| 3,307,081 A | * | 2/1967 | Sloop | 361/666 |
| 3,450,951 A | * | 6/1969 | Boyle | 361/664 |

\* cited by examiner

*Primary Examiner* — Dhirubhai R Patel
(74) *Attorney, Agent, or Firm* — McCormick, Paulding & Huber LLP

(57) ABSTRACT

A meter box cover including a first portion that engages an inner surface of an opening in a lid of a meter box to prevent the passage of the cover through the opening and a second portion that extends through the opening and beyond an outermost surface of the opening in the lid of the meter box. The meter cover blocks substantially an entirety of the opening and the second portion prevents the cover from being displaced within the opening.

21 Claims, 12 Drawing Sheets

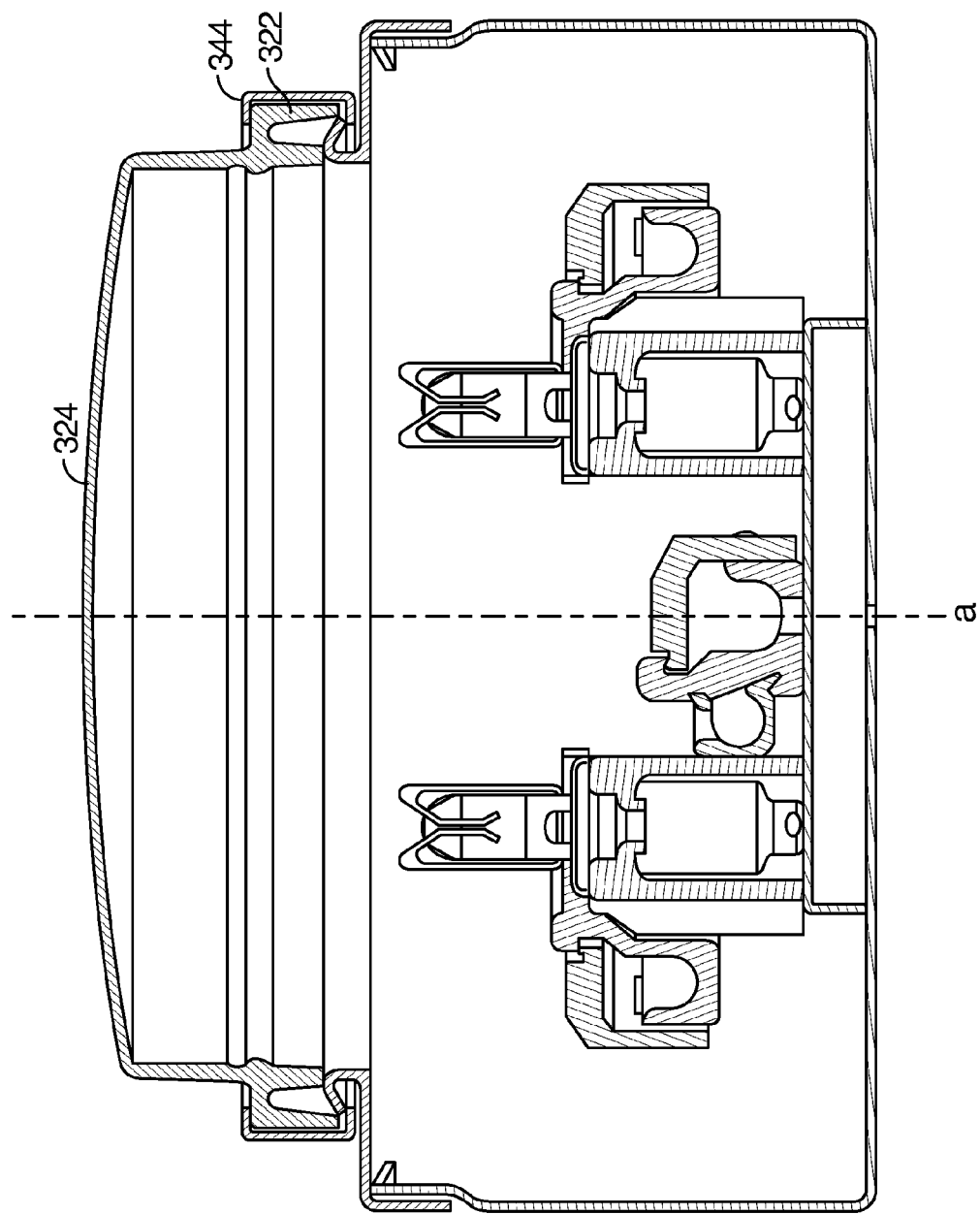

METER BOX COVER

CROSS REFERENCE TO RELATED APPLICATIONS

This application claims priority from U.S. Provisional Application No. 61/442,545, filed on Feb. 14, 2011, which is hereby incorporated by reference in its entirety.

FIELD OF THE INVENTION

The present invention relates generally to a meter box cover, and more particularly to a tamper resistant meter box cover for preventing unauthorized access to a meter box or similar enclosure.

BACKGROUND OF THE INVENTION

Utility boxes, such as electric meter boxes, are typically rectangular metal structures that include a base portion and a removable lid. The lid includes a central opening through which the meter protrudes. Such boxes are generally secured with a lock to prevent unauthorized access to the meter. Some boxes feature a lockable meter ring, which is placed directly around the lid opening and meter and locked. Other utility boxes, referred to as 'ringless' boxes, do not include a lockable meter ring and are secured by placing a lock on either a side-wall or a bottom wall of the box to prevent the lid from being removed from the base portion.

At certain times, however, the meter may be completely removed from the meter box. As will be readily appreciated, when this occurs it is necessary to block access to the electric terminals that reside within the socket, both to prevent unauthorized use of electricity and to ensure safety. To accomplish this, the central opening in the meter socket lid must be covered or obstructed. Known solutions involve the use of a plastic cover that includes a thin metal plate. While generally effective, such covers do not fit closely within the central opening of the lid and may be pried out of position and removed. Moreover, known covers are not structurally rigid enough to withstand the abuse of an extended period of time in the field.

With the forgoing problems and concerns in mind, it is the general object of the present invention to provide a meter box cover that offers a high degree of tamper resistance and durability and an ease of manufacture.

SUMMARY OF THE INVENTION

It is an object of the present invention to provide a meter box cover.

It is another object of the present invention to provide a tamper resistant meter box cover for a ringless meter socket.

It is another object of the present invention to provide a tamper resistant meter box cover for a ring style meter socket.

An embodiment of the invention is a meter box cover including a first portion that engages an inner surface of an opening in a lid of a meter box to prevent the passage of the cover through the opening and a second portion that extends through the opening and beyond an outermost surface of the opening in the lid of the meter box. The second portion prevents the cover from being displaced within the opening thereby preventing unauthorized access to an interior of the meter box.

Another embodiment of the invention is a meter box cover for a ring-style meter box, the cover including a first portion that is configured to both receive a meter ring and operatively engage a flange on an exterior of a lid of the meter box, the flange defining an opening in the lid and a second portion that blocks an entirety of the opening in the lid. The first portion may be selectively secured to the flange through the use of the meter ring and a lock.

Another embodiment of the invention is a method of manufacturing a meter box cover, the method includes forming a first portion that engages a lid of a meter box to prevent its removal and forming a second portion that blocks substantially the entirety of an opening in the lid. The cover has an axis and the first and second portions are axially displaced from each other.

This and other objectives of the present invention, and their preferred embodiments, shall become clear by consideration of the specification, claims and drawings taken as a whole.

BRIEF DESCRIPTION OF THE DRAWINGS

FIG. 15 is a perspective view of the meter box cover of FIGS. 13 and 14 mounted on a meter box.

DETAILED DESCRIPTION OF THE PREFERRED EMBODIMENT

Figure 1:
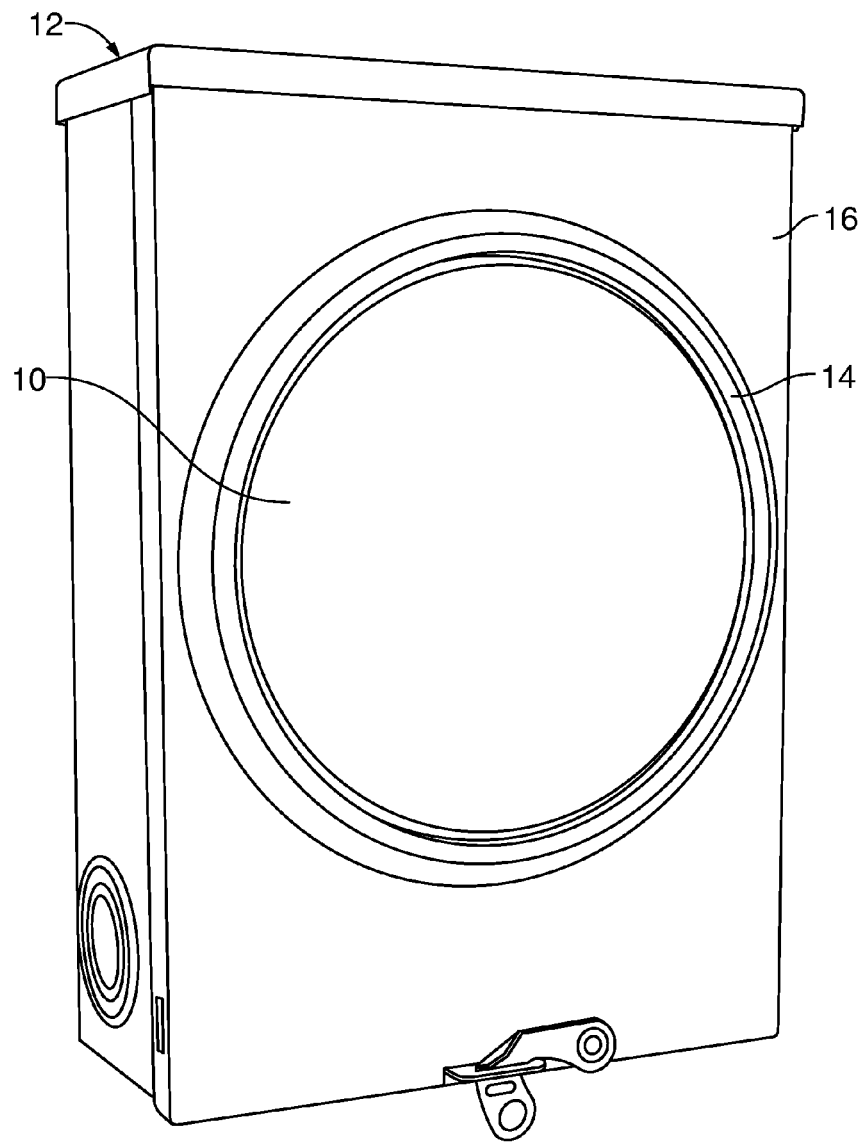
FIG. 1 is a perspective view of a prior art meter box cover mounted on a ringless meter box.
Figure 2:
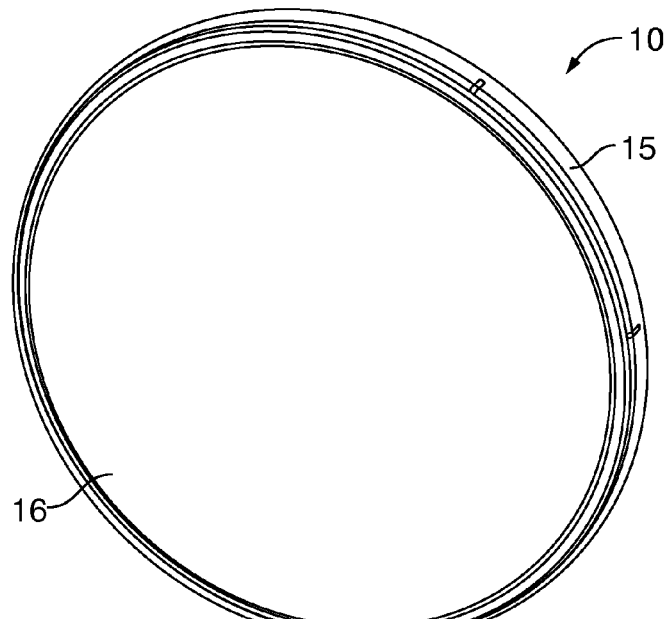
FIG. 2 is a perspective front view of the prior art meter box cover of FIG. 1.
Figure 3:
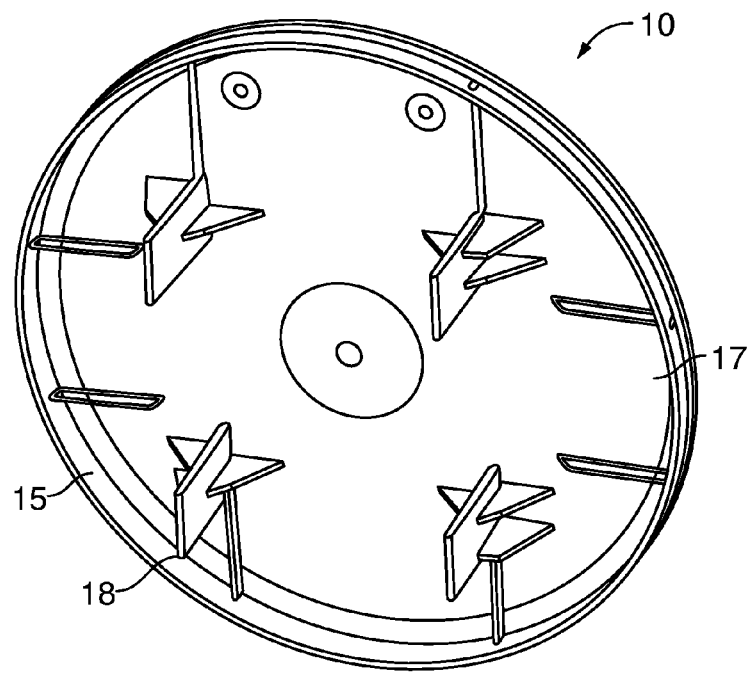
FIG. 3 is a perspective rear view of the prior art meter box cover of FIG. 1.

FIGS. 1-3 are perspective views of a prior art meter box cover 10. In particular, FIG. 1 shows the prior art meter box cover 10 mounted on a ringless meter box 12. As shown, the cover 10 is substantially flush with the lip 14 of the central opening in the box lid 16 when installed. Moreover, the cover 10 does not fit particularly closely within the extended lip 14 that defines the opening of the lid 16 and does not extend beyond the boundary of the opening in the interior of the box 12. As such, a potential problem with this design is that the cover 10 may be pried upward or downward relative to the lid opening to gain access to the interior of the box 12 and the electric terminals inside.

Turning now to FIGS. 2 and 3, the prior art box cover 10 is also not particularly robust. Indeed, the two-piece cover 10 features a plastic backing 17 to which a thin metal insert 16 is attached. The plastic backing 17 includes a side wall 15 and series of tabs 18 which, when in use extend into meter socket lugs. The thin tabs 18, however, may be broken both through tampering and through abuse sustained when deployed in the field for an extended period. Moreover, prior art cover is a multi-component structure requiring assembly.

Figure 4:
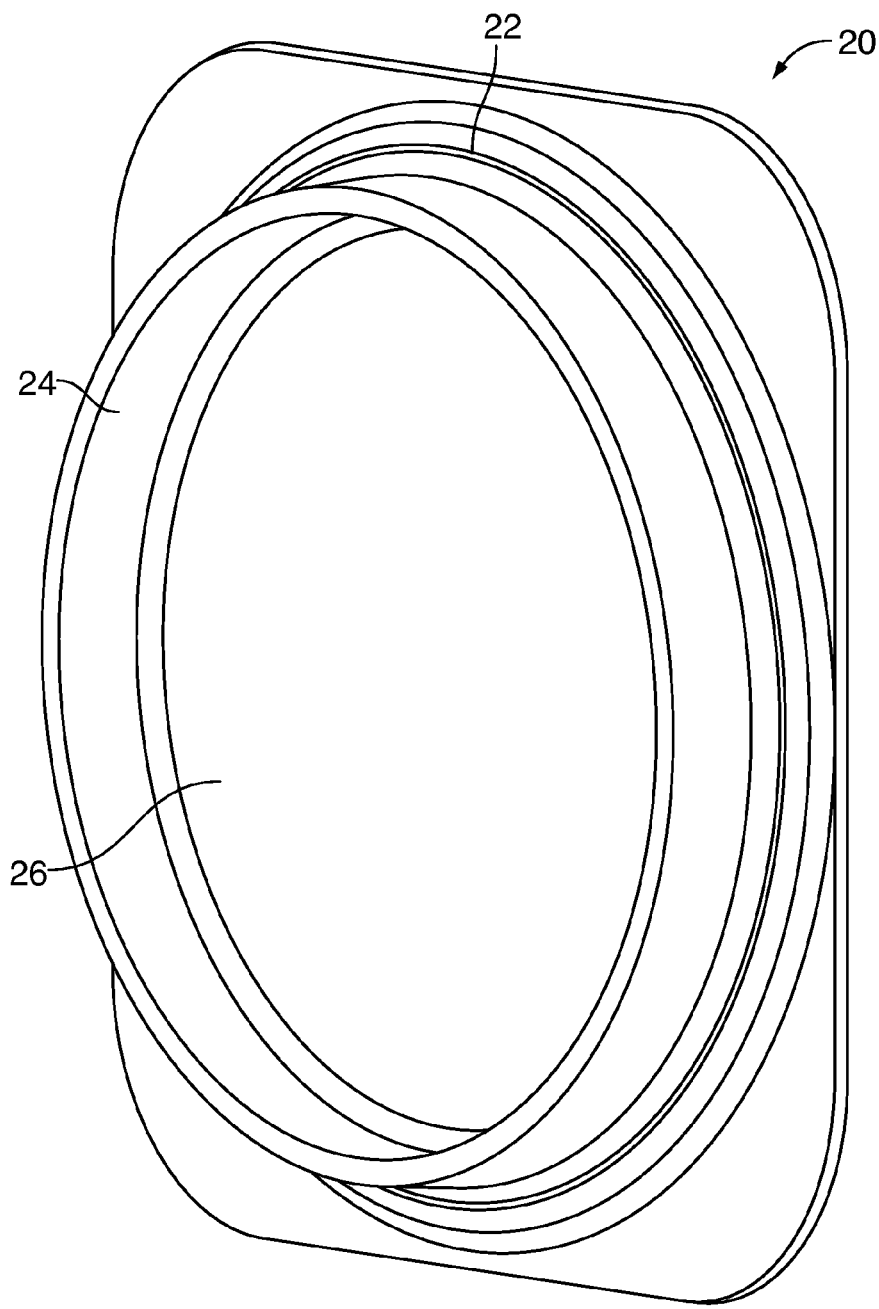
FIG. 4 is a perspective front view of a meter box cover in accordance with an embodiment of the present invention.
Figure 5:
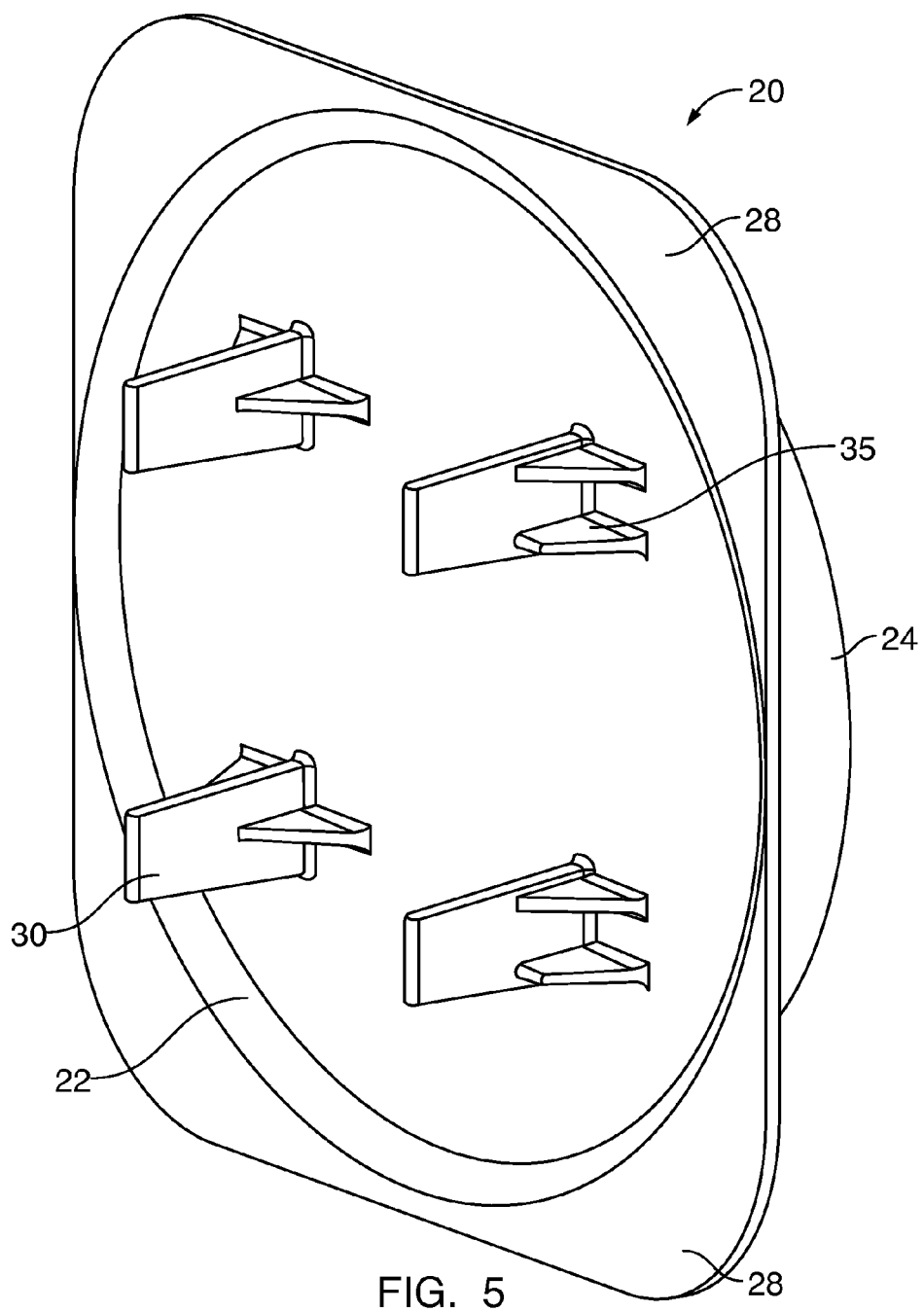
FIG. 5 is a perspective rear view of the meter box cover of FIG. 4.

FIGS. 4 and 5 depict an embodiment of the inventive meter box cover 20. The cover 20 includes a first portion 22 that is configured to engage an interior surface of the cover of the meter box and, in particular, the interior of annular protrusion or boundary that defines the opening through which the meter extends. The cover 20 further includes a second portion 24, here an annular rim, that extends from the first portion 22. The second portion 24 is configured to extend through the opening in the meter box lid. Moreover, the cover 20 includes a substantially flat face portion 26, which blocks substantially an entirety of the opening in the meter box lid so that the interior of the meter box cannot be accessed.

As shown in FIG. 5, a rear view of cover 20, the cover also includes flanges 28 that extend from the first portion 22. The flanges 28 are configured to engage an inner surface of the lid, when the cover is pulled forward, to further prevent the passage of the cover 20 through the opening of the lid and movement of the cover within the opening. In one embodiment, the cover 20 has four flanges 28 giving the cover 20 a substantially rectangular profile.

Figure 6:
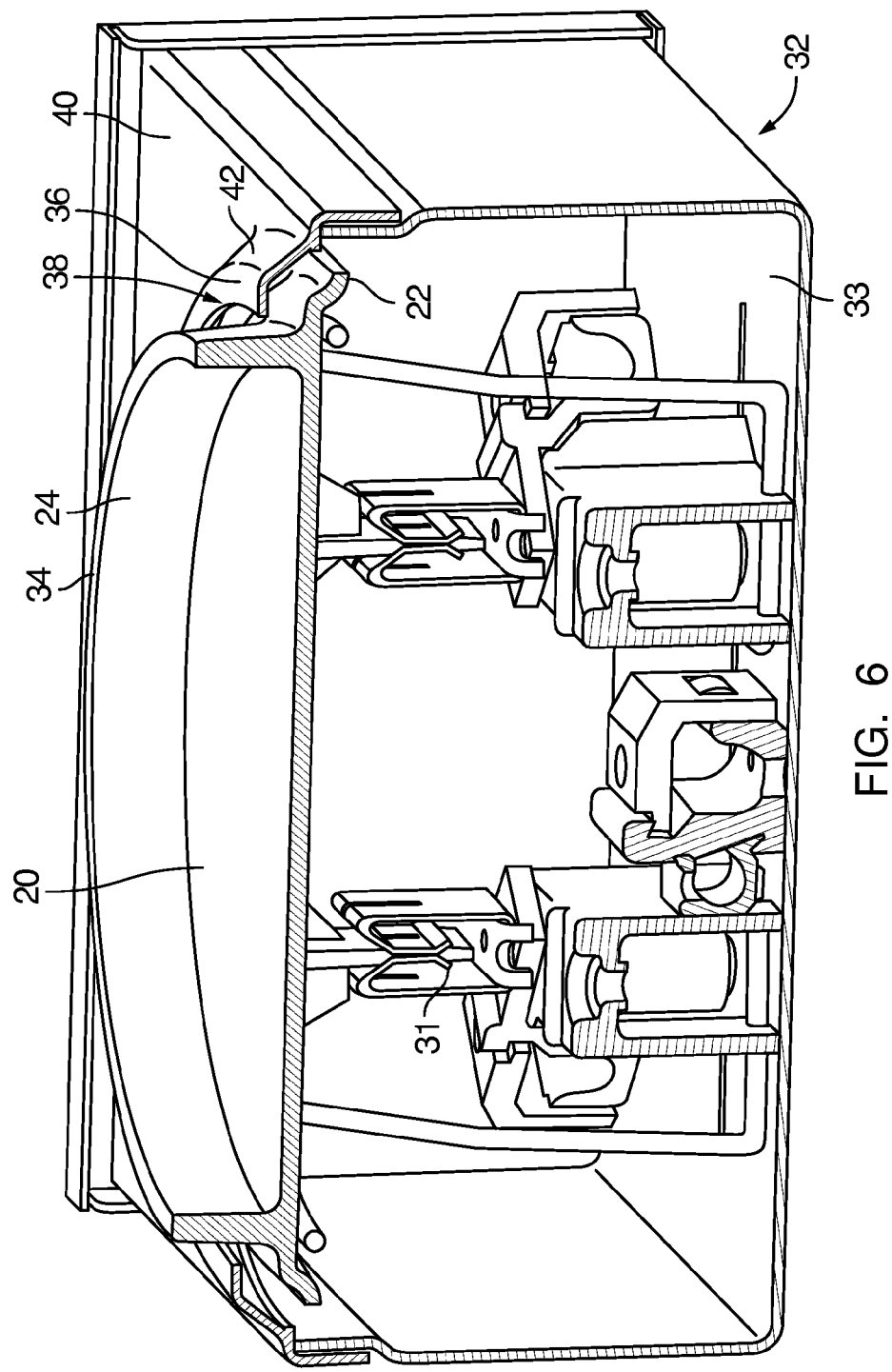
FIG. 6 is a cutaway perspective view of the meter box cover of FIG. 4 mounted on a ringless meter box.
Figure 7:
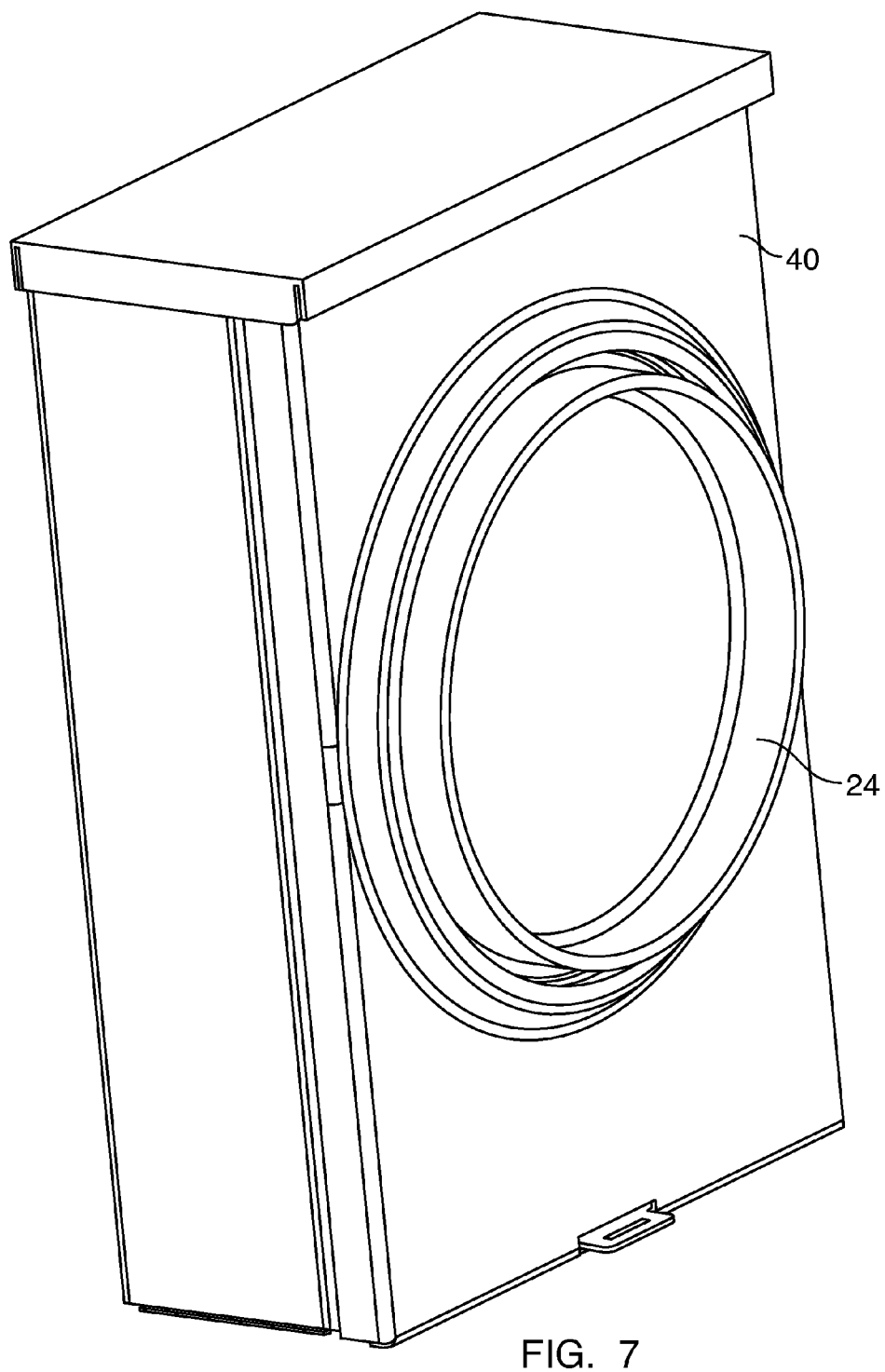
FIG. 7 is a perspective view of the meter box cover and meter box of FIG. 6 depicting a flange of the meter cover protruding from the meter box.

FIG. 5 also depicts four tabs 30 extending from the rear of the face portion. The tabs 30 are configured to extend into meter sockets 31 within the base portion 33 of the meter box (FIG. 6). In particular, the tabs 30 include ribs 35 that impart strength and rigidity to the tabs 30 and also function as a dead stop. That is, the dead stop of the ribs 35 against the interior of the meter socket prevents the cover 20 from being pushed further toward the sockets to potentially access the interior of the box. Similarly, the dead stop alerts an installer to when the cover is in a fully installed position.

Turning now to FIG. 6, the cover 20 is shown mounted within a meter box 32. As depicted, the second portion 24 is an annular rim that has a terminal end portion 34 that extends beyond an outermost surface 36 of the opening 38 in the meter box cover 40. The first portion 22 has a shape that substantially matches the shape of the interior of the rim or annular protrusion 42 that defines the opening 38 in the lid 40. As shown, the first portion 22 may have a stepped or similar shape. As will be appreciated, the first portion 22 and the flange prevent the cover 20 from passing through the opening 38 and from moving within the opening.

Indeed, in use, the extension of the second portion 24 through the opening and the close fit of the first portion 22 within the annular protrusion that defines the opening prevents displacement of the cover 20 in the opening.

Figure 8:
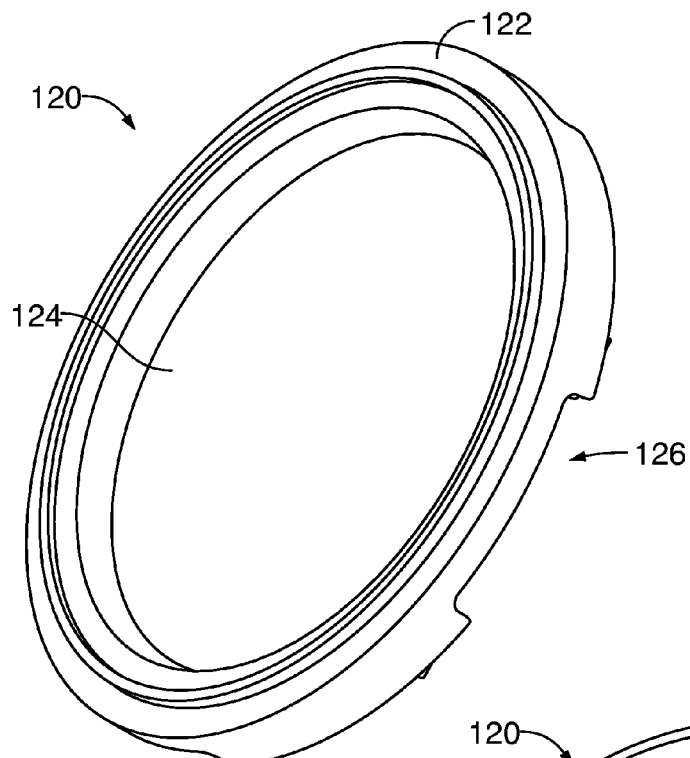
FIG. 8 is a perspective front view of a meter box cover configured for use with a ring style meter box in accordance with an alternative embodiment of the present invention.
Figure 11:
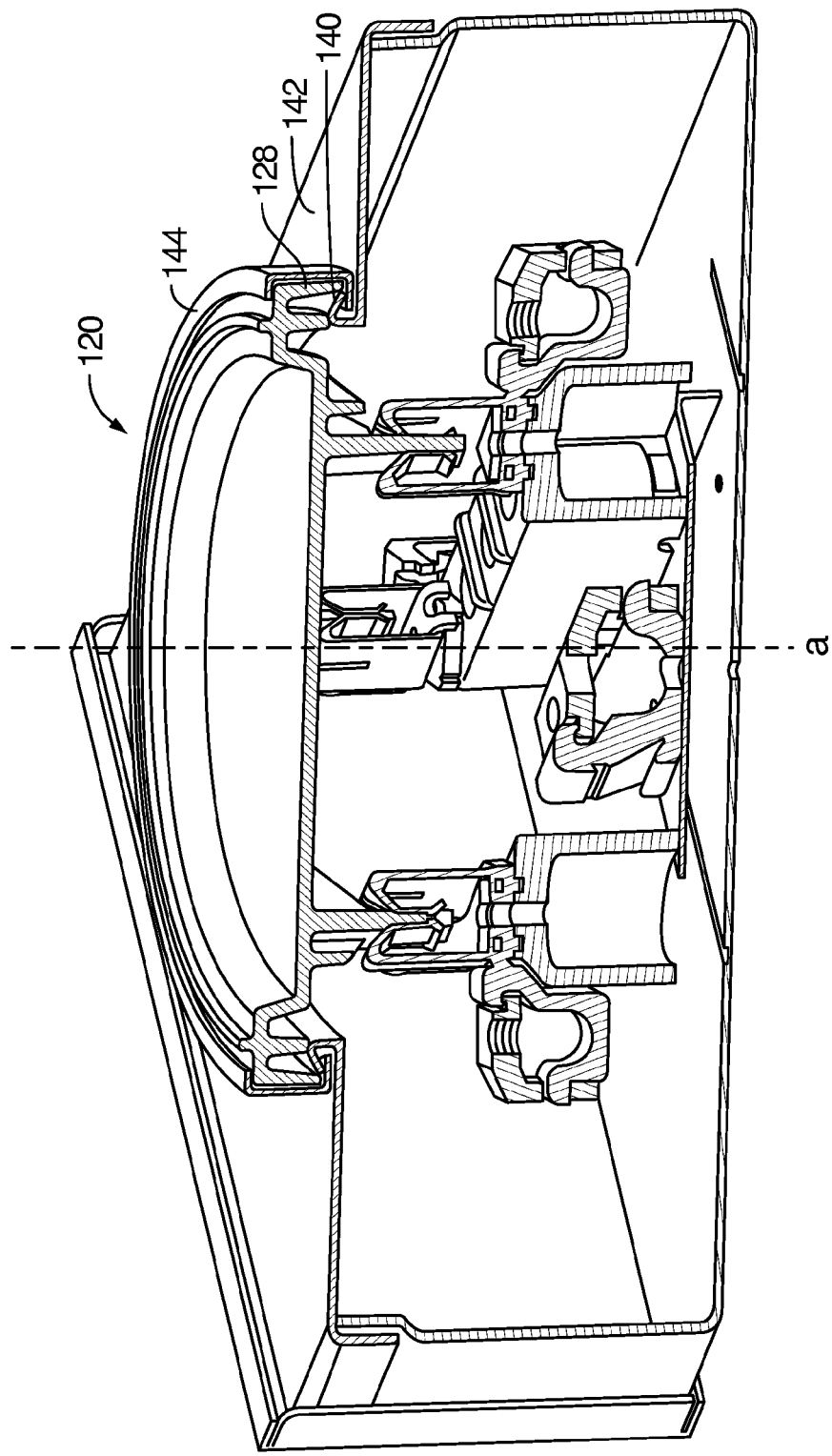
FIG. 11 is a cutaway perspective view of the meter box cover of FIG. 8 installed on a ring style meter box.

Turning now to FIG. 8, an embodiment of the cover 120 may be used with ring style meter boxes. This embodiment includes annular first portion 122 that is configured to receive a meter ring to secure the cover 120 to the meter. The cover 120 further includes a face or second portion 124 that blocks the entirety of the opening of a meter box lid. The second portion is offset, e.g., inset, from the annular first portion 122. In particular, the first portion and second portions are axially offset from one another about a lid opening axis a. (FIG. 11).

As shown, the first portion 122 also includes at least one cut away portion 126 which allows the cover 120 to be gripped and removed once the meter ring has been unlocked and removed.

Figure 9:
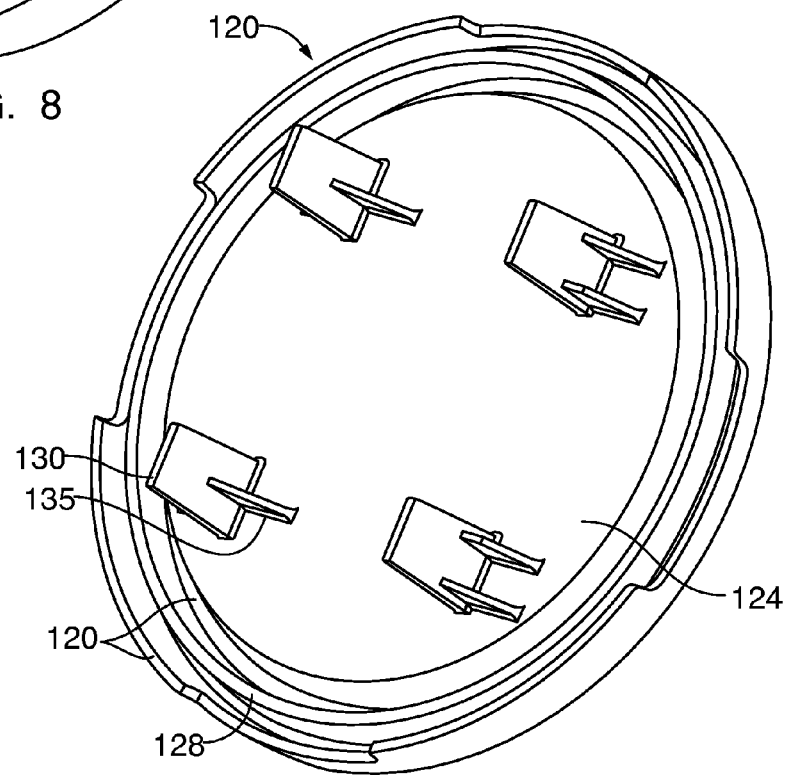
FIG. 9 is a perspective rear view of the meter box cover of FIG. 8.

FIG. 9 depicts a reverse side of the embodiment shown in FIG. 8. As illustrated, the cover 120 includes at least one tab 130, which is structurally reinforced with at least one rib 135.

Figure 10:
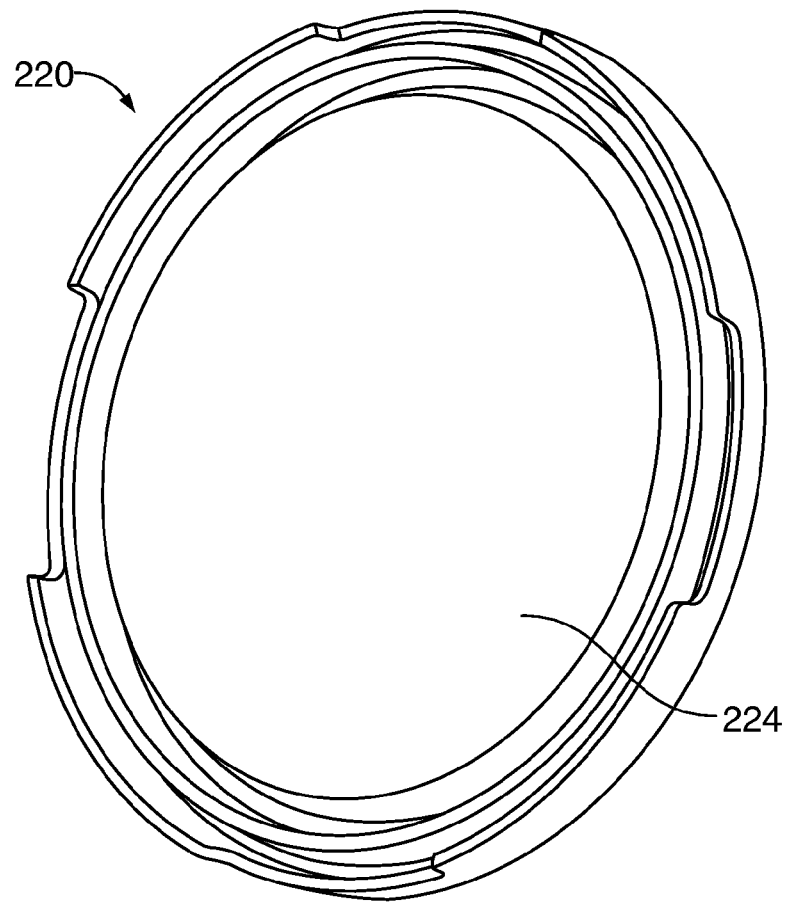
FIG. 10 is a perspective rear view of an alternative embodiment of the meter box cover of FIG. 8.

As mentioned above, the ribs 135 can function as a dead stop within a socket. In an embodiment, the cover 120 includes four tabs 130. Alternatively, in other embodiments such as the embodiment shown in FIG. 10, the cover 220 may include no tabs.

Still referring to FIG. 9, the cover 120 also includes an annular ridge 128 that is located within the first potion 122, which, as shown, has a substantially u-shaped profile. The ridge 128 provides structural rigidity to the first portion 120 and serves as a stop against the flange 140 of a ring style meter box lid 142.

Figure 12:
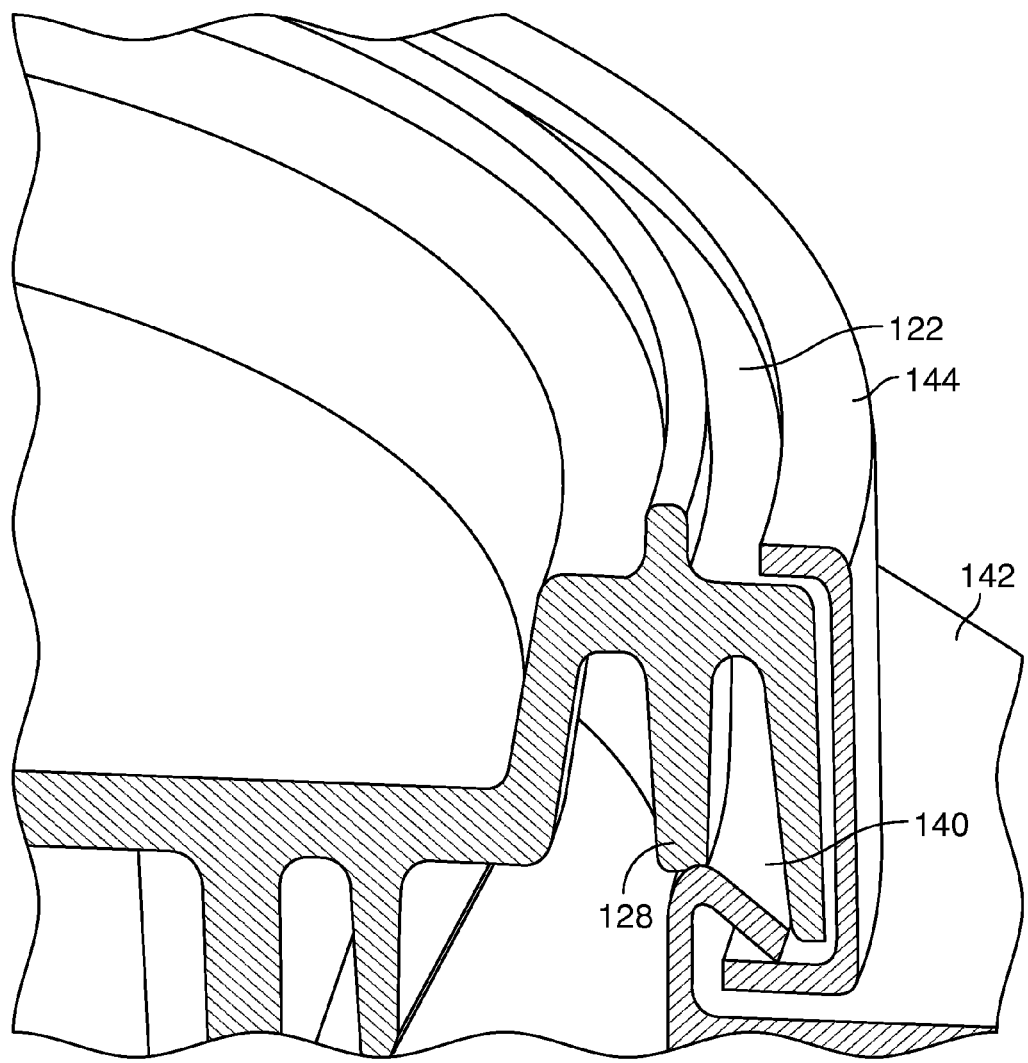
FIG. 12 is a detail perspective view of the meter box cover and box of FIG. 11.

FIGS. 11 and 12, depict the cover 120 secured to a ring style meter box. In particular, the cover 120 is placed over the flange 140 of the lid 142 such that the ridge 128 abuts the flange 140. A locking ring 144 having a substantially u-shaped cross-sectional profile is then placed over the first portion 122 of the cover 120 so that the ring 144 extends under the flange 140 and over the front of the first portion 122. The ring 144 may then be locked in place, preventing removal of the cover 120.

Figure 13:
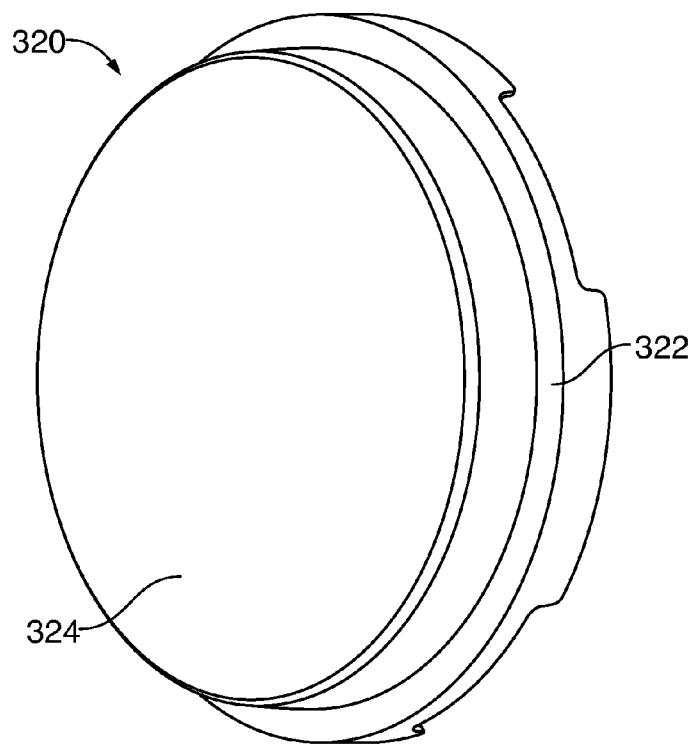
FIGS. 13 and 14 are perspective front and rear views of an alternative embodiment of the meter box cover of FIG. 8.
Figure 14:
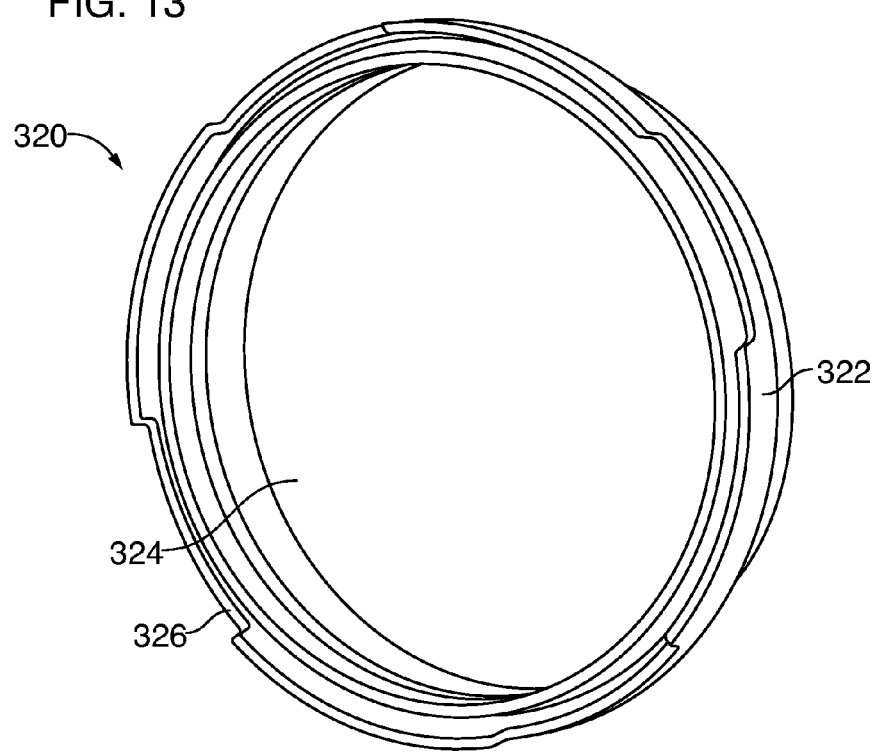

Turning now to FIGS. 13-15, another embodiment of the meter cover 320 is shown. This embodiment is also configured for use with a ring-style meter box. As depicted, the cover 320 includes an annular first portion 322 that closely fits over a flange of a meter lid and a face or second portion 324 that blocks the entirety of the opening in the lid defined by the flange. In this embodiment, the second portion 324 is axially offset outward from the first portion 322 about opening axis a. The first portion 322 includes at least one cut away portion 326 to facilitate removal of the cover 320.

As shown in FIG. 15, the second portion 324 has a substantially convex profile. The convex profile adds strength and rigidity to the cover 320. In use, the cover 320 is placed over the flange of the lid. A locking ring 344 having a u-shaped profile is then placed over the first portion 322 of the cover 320 so that the ring 344 extends under the flange and over the front of the first portion 322, and then locked in place.

In an embodiment of the present invention, the inventive cover is a unitary molded product formed from a relatively thick gauge impact and UV-resistant material such as polycarbonate. As will be appreciated, however, other suitably durable materials may be employed.

One of ordinary skill in the art will understand that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable any person of ordinary skill in the art to practice the embodiments of invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described embodiments, without departing from the spirit and scope of the meter cover herein involved, it is intended that all of the subject matter of the above description or shown in the accompanying drawings shall be interpreted merely as examples illustrating the inventive concept herein and shall not be construed as limiting the invention.

What is claimed is:

1. A meter box cover comprising:
    a first portion that engages an inner surface of an opening in a lid of a meter box to prevent the passage of the cover through the opening;
    a second portion that extends through the opening and beyond an outermost surface of the opening;
    a face portion that blocks substantially an entirety of the opening; and
    a flange that extends outward from the first portion in a direction generally perpendicular to a direction of extension of the second portion, the flange being configured to abuttingly engage an interior of the lid to prevent removal of the cover;
    wherein extension of the second portion through the opening prevents the cover from being displaced within the opening.

2. The meter box cover of claim 1 wherein the first portion has a shape that substantially matches a shape of a boundary that defines the opening in the lid.

3. The meter box cover of claim 1 wherein the flange is substantially co-planar with the lid.

4. The meter box cover of claim 1 wherein the cover further comprises at least one tab configured to extend into a meter socket located within the meter box to help secure the cover within the box, the tab having a rib that functions as a stop.

5. The meter box cover of claim 4 wherein the cover includes four tabs.

6. The meter box cover of claim 1 wherein the cover is a unitary molded structure.

7. The meter box cover of claim 1 wherein the cover is manufactured from an impact resistant polymeric material.

8. The meter box cover of claim 1 wherein the opening is defined by an annular lip that extends from a substantially flat outer lid surface.

9. The meter box cover of claim 8 wherein the first portion is annular and has a stepped shape that substantially matches a shape of an inner surface of the annular lip.

10. The meter box cover of claim 1 wherein the second portion further includes an annular rim having a terminal end portion that extends beyond an outermost surface of the opening; and
    wherein the face portion is substantially co-planar with an exterior surface of the lid and is offset from the terminal end portion of the rim.

11. The meter box cover of claim 1 wherein the meter cover is configured for use with a ringless meter box.

12. A meter box cover for a ring-style meter box, the cover comprising:
    a first portion that is configured to both receive a meter ring and operatively engage a flange on an exterior of a lid of the meter box, the flange defining an opening in the lid;
    a second portion that blocks an entirety of the opening in the lid;
    wherein the first portion may be selectively secured to the flange through the use of the meter ring.

13. The meter box cover of claim 12 wherein the first portion has a shape that substantially corresponds to a shape of an interior of the meter ring.

14. The meter box cover of claim 12 wherein the first portion has at least one cut out to facilitate authorized removal of the cover from the lid once the meter ring has been removed.

15. The meter box cover of claim 12 wherein the cover further comprises at least one tab configured to extend into a meter socket located within the meter box to help secure the cover within the box.

16. The meter box cover of claim 15 wherein the cover includes four tabs.

17. The meter box cover of claim 12 wherein the cover is a unitary molded structure.

18. The meter box cover of claim 12 wherein the cover is manufactured from an impact resistant polymeric material.

19. The meter box cover of claim 12 wherein the opening has an axis and the first portion has an outermost surface that is axially offset from the second portion.

20. The meter box cover of claim 12 wherein the second portion has a substantially convex profile.

21. A method of manufacturing a meter box cover, the method comprising:
    forming a first portion that engages a lid of a meter box to prevent its removal;
    forming a second portion that extends through an opening in the lid and beyond an outermost surface of the opening;
    forming a face portion that blocks substantially the entirety of an opening in the lid; and
    forming a flange that extends outward from the first portion in a direction generally perpendicular to a direction of extension of the second portion that is configured to abuttingly engages an interior of the lid to prevent removal of the cover;
    wherein the cover has an axis and the first portion and the face portion are axially displaced from each other.

* * * * *